United States Patent
Minami

[11] Patent Number: 6,033,532
[45] Date of Patent: *Mar. 7, 2000

[54] OXIDE FILM FABRICATION METHOD AND ELECTRONIC DEVICE

[75] Inventor: Hiroaki Minami, Osaka-fu, Japan

[73] Assignee: Read-Rite SMI Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/807,175

[22] Filed: Feb. 27, 1997

[30] Foreign Application Priority Data

Feb. 27, 1996 [JP] Japan .................................... 8-067279

[51] Int. Cl.[7] ...................................................... C23C 14/34
[52] U.S. Cl. ................................ 204/192.11; 204/192.16; 204/192.22; 204/192.23; 204/192.3; 216/22; 216/52
[58] Field of Search .......................... 204/192.11, 192.15, 204/192.16, 192.23, 192.22, 192.31, 298.26, 192.26; 427/127; 216/22, 52, 53

[56] References Cited

U.S. PATENT DOCUMENTS

| | | |
|---|---|---|
| 4,036,723 | 7/1977 | Schwartz et al. .................. 204/192.22 |
| 4,142,958 | 3/1979 | Wei et al. ............................ 204/192.11 |
| 5,062,937 | 11/1991 | Komuro ............................. 204/192.15 |
| 5,225,953 | 7/1993 | Wada et al. .............................. 360/126 |
| 5,268,217 | 12/1993 | Kimock et al. .......................... 428/216 |

*Primary Examiner*—Rodney G. McDonald
*Attorney, Agent, or Firm*—Blakely Sokoloff Taylor & Zafman, LLP

[57] ABSTRACT

A method of forming an oxide film over the substrate of an electronic device. In one embodiment, a first metal oxide film layer is deposited on the substrate of the electronic device by bias sputtering. Then, a second metal oxide film layer is deposited by ion beam sputtering on the first metal oxide film layer. In another embodiment, a first metal oxide film layer is deposited on the substrate of the electronic device by ion beam sputtering. Then, a second metal oxide film layer is deposited by bias sputtering on the first metal oxide film layer. In yet another embodiment, a first metal oxide film layer having a first degree of purity is deposited on the substrate of the electronic device. Then, a second metal oxide film layer having a second degree of purity is deposited on the first metal oxide film layer. The first degree of purity is different than the second degree of purity.

5 Claims, 5 Drawing Sheets

OXIDE FILM FABRICATION METHOD AND ELECTRONIC DEVICE

BACKGROUND OF THE INVENTION

1. Technical Field of the Invention

The present invention relates to a method for forming an oxide film by depositing an oxide on a substrate by sputtering, and is particularly suited to forming an insulating layer in an electronic device exemplified by ICs or thin film magnetic heads.

In addition, the present invention relates to an electronic device in which the specific element formation layer is deposited on the insulating layer.

2. Background Information

Electronic devices, such as ICs and thin film magnetic heads, support Japan's industries. Every day new applications and new structures are developed.

There are many types of electronic devices. Most of these devices form an insulating layer of metal oxide film on a silicon wafer or a ceramic substrate on which a particular element formation layer is deposited.

In a thin film magnetic head, for example, an $Al_2O_3$-TiO system ceramic is the substrate, and a metal oxide thin film of silicon dioxide or aluminum oxide ($Al_2O_3$, alumina) is formed on this substrate. This oxide film functions as the insulating layer.

These oxide films are usually formed by bias sputtering (Unexamined Japanese Patent No. 6-49637, Japanese Laid Open Patent No. 7-56070).

Bias sputtering is one type of sputtering. In addition to applying a negative voltage or a high-frequency voltage, a bias voltage is also applied to the substrate that is the deposition target.

Next, bias sputtering is described in detail.

Figure 4:
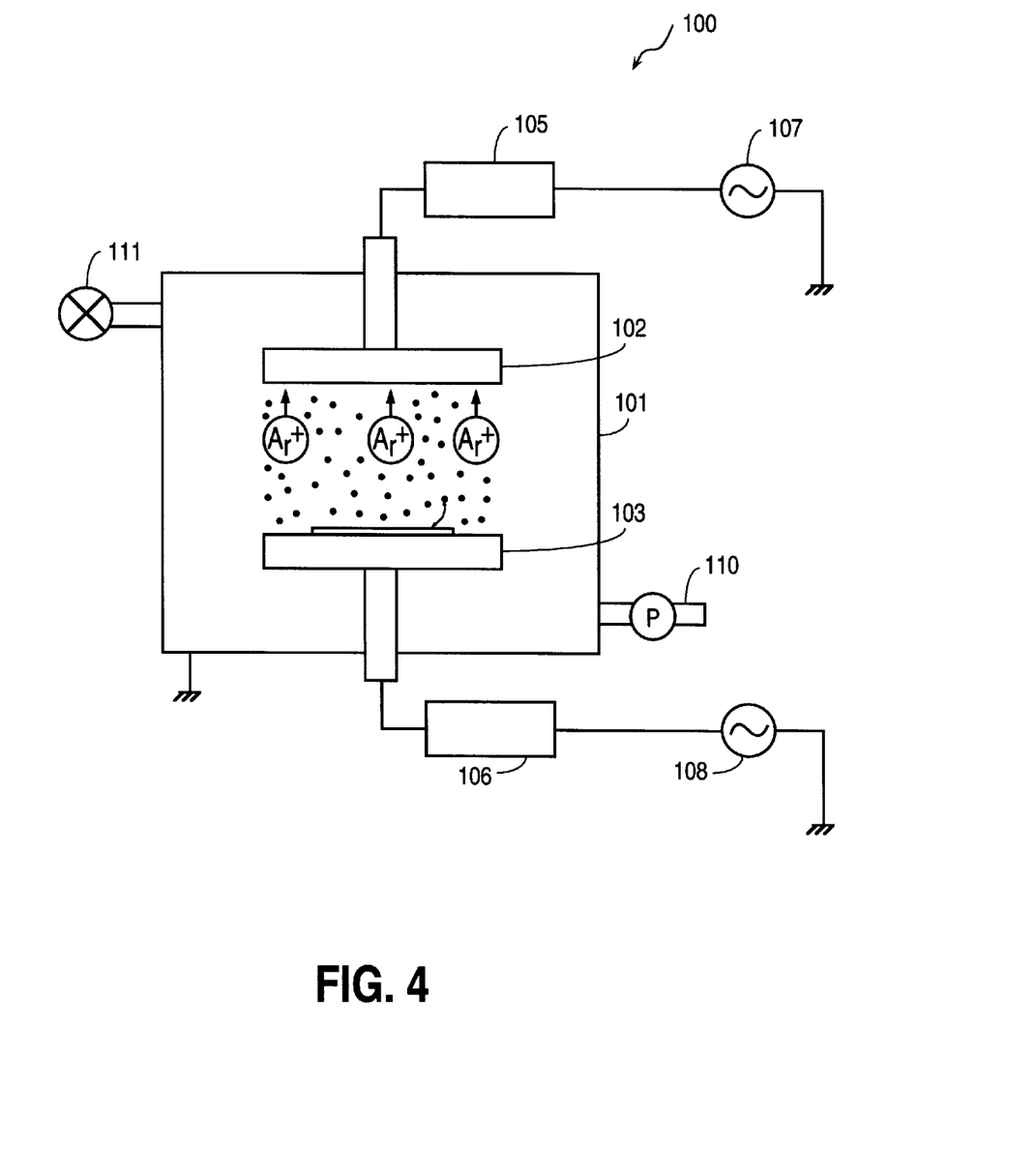
FIG. 4 is a diagram of the bias sputtering system.

For example, the metal oxide film is deposited by bias sputtering by using a bias sputtering system 100 like the one shown in FIG. 4.

In the bias sputtering system 100, the electrode called the target 102 is positioned opposite the substrate holder 103 in the airtight chamber 101. The target 102 and the substrate holder 103 are connected to the high-frequency power source (RF power source) 107 and the high-frequency power source (RF power source for biasing) 108 through the matching circuits 105 and 106, respectively.

The pressure reducing vacuum pump 110 and the gas supply source 111 for plasma generation are connected to the chamber 101.

In the bias sputtering system 100, the target 102 is a metal oxide film material made of aluminum oxide.

The substrate 1 that is the deposition target is mounted in the substrate holder 103.

The chamber 101 has an environment of a plasma generation gas (i.e., Ar, mixed gases of Ar and $O_2$ or $N_2$ in reactive sputtering) and applies the high-frequency voltage to the target 102 and the bias voltage to the substrate holder 103.

This generates a glow discharge plasma inside the chamber 101. Ar+ ions are attracted to the negative voltage of the target 102 and collide with the target 102.

The result is the metal oxides in the surface of the target 102 are sputtered. Then, the sputtered metal oxides adhere to the substrate 1 in the substrate holder 103.

In bias sputtering, because the bias voltage is also applied to the substrate 1, the metal oxides sputtered from the target 102 are attracted to the negative potential of the substrate 1, ion collisions occur with the metal oxides that already adhere to the substrate 1, and the metal oxides are released again. The result is the smoothing of the metal oxides on the substrate 1.

After the metal oxide is deposited in this manner on the substrate 1, it is chemically polished by alkali colloidal silica or colloidal alumina to further smooth the surface of the substrate 1. Then a magnetic film, a gap layer, and a conducting coil layer are deposited in layers on this substrate to fabricate the desired thin film magnetic head.

The methods for forming oxide film employing conventional technologies have spread widely as methods for fabricating the insulating layer, such as a thin film magnetic head, and produce a substrate 1 with a fairly smooth surface.

However, the methods described above that use conventional technologies have limits in the degree of smoothness of the substrate surface. In the end, unfortunately, some microscopic pits (concavities) remain on the surface.

In other words, even when the methods used previously for forming oxide film polish the substrate surface or control the film deposition conditions, such as the sputter gas flow, gas pressure, voltage applied on the target side, and substrate voltage, microscopic pits develop on the surface of the oxide film.

The reasons are explained next.

Figure 5:
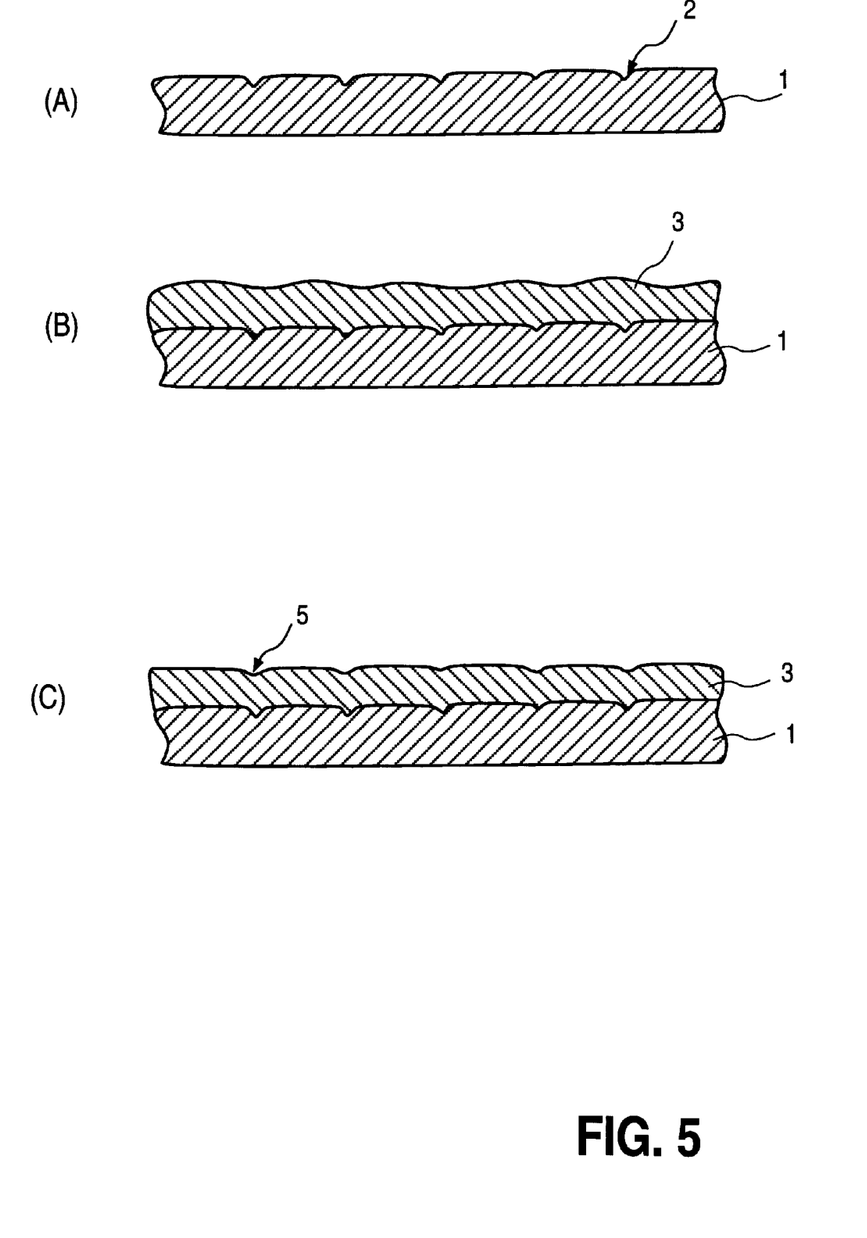
FIG. 5 shows the process of the method of forming the oxide film of the conventional technology and shows the states when the oxide film is formed on the substrate.

FIG. 5 is a diagram showing the process in the method for forming the oxide film using conventional technologies and shows the states entered when forming the oxide film on the substrate 1.

In a thin film magnetic head, a ceramic such as $Al_2O_3$-TiO is used as the substrate 1. Since the ceramic is a sintered material, many microscopic dents 2 similar those shown in FIG. 5(a) exist on the surface of the substrate 1.

When the metal oxide film 3 is deposited on the substrate 1 by bias sputtering as described above, the film surface will be uneven after deposition as shown in FIG. 5(b).

As described above, in order to further smooth the surface, the surface is chemically polished by an alkali colloidal silica or colloidal alumina. However, since the film growth differs for the metal oxide film 3 at the dents 2 in the substrate 1 and for the metal oxide film 3 at other places, the film quality exhibits small differences. In other words, the metal oxide film 3 on the dents 2 exhibits slight differences from other parts in the mixture amount of Ar or $O_2$, and the fineness of the film.

Chemical polishing to smooth the film surface creates differences in the film quality, and differences develop in the etching speed at the metal oxide film 3 on the dents 2 and at other locations. Consequently, microscopic pits 5 develop on the metal oxide film 3 after chemical polishing.

Since the substrate surface is etched by the ions when film deposition begins in bias sputtering due to the negative voltage of the substrate side, the dents in the interface between the substrate 1 and the metal oxide film 3 further increase and are believed to be one cause of the pits 5.

When depositing magnetic film on a metal oxide film 3 having these kinds of pits 5, the pits 5 degrade the magnetic film characteristics or lower the yield of heads.

If a 1,000 Å or smaller magnetic film is deposited for use in an MR head, in particular, the effect of the pits increases so the degradation of the magnetic film characteristics and the reduced yield of heads cannot be ignored.

In order to eliminate the microscopic pits 5 on the metal oxide film 3, efforts should concentrate on eliminating the dents 2 in the substrate 1. However, this technique is naturally limited to using a sintered material as the substrate 1.

Although the metal oxide film can be formed by methods other than bias sputtering, these methods have other problems such as requiring a long time to form the metal oxide film or a low film density. In practice, bias sputtering must be used.

Since the microscopic pits 5 on the metal oxide film 3 are difficult to eliminate in the conventional methods, new methods were desired by industry.

The present invention focuses on the problems described above which are found in the conventional technology and develops a method for forming oxide film that does not produce pits on its surface.

SUMMARY OF THE INVENTION

A method of forming an oxide film over the substrate of an electronic device is disclosed. In one embodiment, a first metal oxide film layer is deposited on the substrate of the electronic device by bias sputtering. Then, a second metal oxide film layer is deposited by ion beam sputtering on the first metal oxide film layer.

DESCRIPTION OF THE REFERENCE NUMBERS

1 Substrate
7 Metal oxide film (by bias sputtering)
8 Metal oxide film (by ion beam sputtering)
10 Insulating layer
30 Ion beam sputtering system
100 Bias sputtering system

DETAILED DESCRIPTION

The invention of claim 1 for solving the problems described above is a method that deposits oxides on a substrate by sputtering to form the oxide film. This method for forming an oxide film has a process that forms an oxide film on the substrate by bias sputtering followed by depositing a layer of oxide film on the former oxide film by ion beam sputtering.

This ion beam sputtering method draws out the ions in the high-vacuum process chamber from an independent ion generation source (i.e., ion gun), so that these ions collide with the target. This method was disclosed in Unexamined Japanese Patent No. 6-57411, for example. The present invention also incorporates the concepts underlying ion beam sputtering and sputtering that uses electron cyclotron resonance similar to the technique described in Unexamined Japanese Patent No. 6-2128.

Ion beam sputtering features a higher purity oxide film compared to bias sputtering.

The present invention forms the oxide film on the substrate by bias sputtering and then deposits a layer of oxide film by ion beam sputtering. An oxide film with a high degree of purity made by ion beam sputtering is placed on the oxide film made by bias sputtering. Specifically, the film quality of the surface is almost constant regardless of the position.

When an oxide film made by the present invention is chemically polished after film deposition, the etching speed is constant at any position, and the surface is processed to be flat.

The invention of claim 2 for achieving the same objective is a method that deposits oxides on a substrate by sputtering to form an oxide film. This method for forming the oxide film comprises a process that forms the oxide film on the substrate by ion beam sputtering followed by depositing an oxide film layer by bias sputtering on the former oxide film.

In contrast to the preceding invention, the invention of claim 2 reverses the operation based on bias sputtering and the operation based on ion beam sputtering. Now, bias sputtering is performed after ion beam sputtering.

In the present invention, ion beam sputtering performs deposition before bias sputtering. Since etching was thought to be one cause of pits on the oxide film surface, there is little etching of the substrate surface by ions during the initial film deposition. The initial ion beam sputtering fills in the dents in the substrate surface. Then bias sputtering forms a homogeneous oxide film. Therefore, when this is chemically polished, the surface of the oxide film becomes smooth.

The invention that improves the two inventions described above is the method for forming the oxide film as in claim 1 or 2 that features a thickness for the oxide film formed by ion beam sputtering which is 1 to 10% the thickness of the oxide film formed by bias sputtering.

Specifically, when the film thickness of the oxide film formed by ion beam sputtering is 1% or less than the film thickness produced by bias sputtering, usually, the pits cannot be completely filled in.

In contrast, if the film thickness of the metal oxide film formed by ion beam sputtering exceeds 10% of the film thickness produced by bias sputtering, the usability in industry drops because the film deposition speed is slow in ion beam sputtering.

Theoretically, if a large ion gun with a large current is used, the film deposition speed increases even when using ion beam sputtering. However, building this kind of ion gun is expensive, so it is not practical.

For an electronic device that provides an insulating layer of metal oxide film on the substrate and a specific element formation layer deposited on said insulating layer, the invention of the ion device that applies the invention described above features insulating layers of metal oxide film which are two or more layers of metal oxides has an insulating layer of the metal oxide film, where at least one layer in a combination of two neighboring layers is made of metal oxides of the same material, but has a different degree of purity.

Next, an implementation of the present invention that assumes the structure of a thin film magnetic head is explained while referring to FIGS. 1 to 4.

Figure 1:
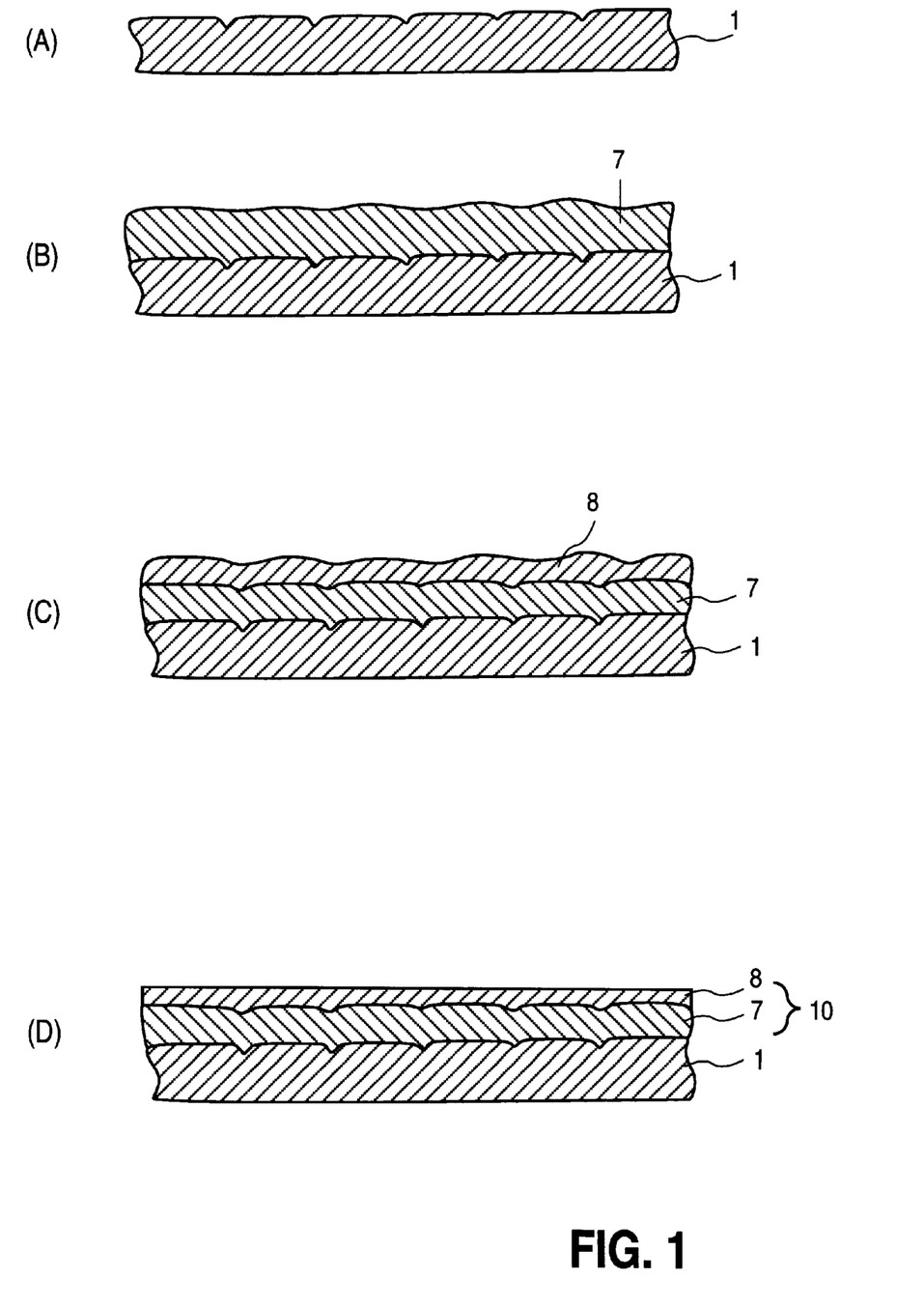
FIG. 1 shows the process of the method for forming the oxide film of an embodiment of present invention and shows the states when the oxide film is formed on the substrate.
Figure 2:
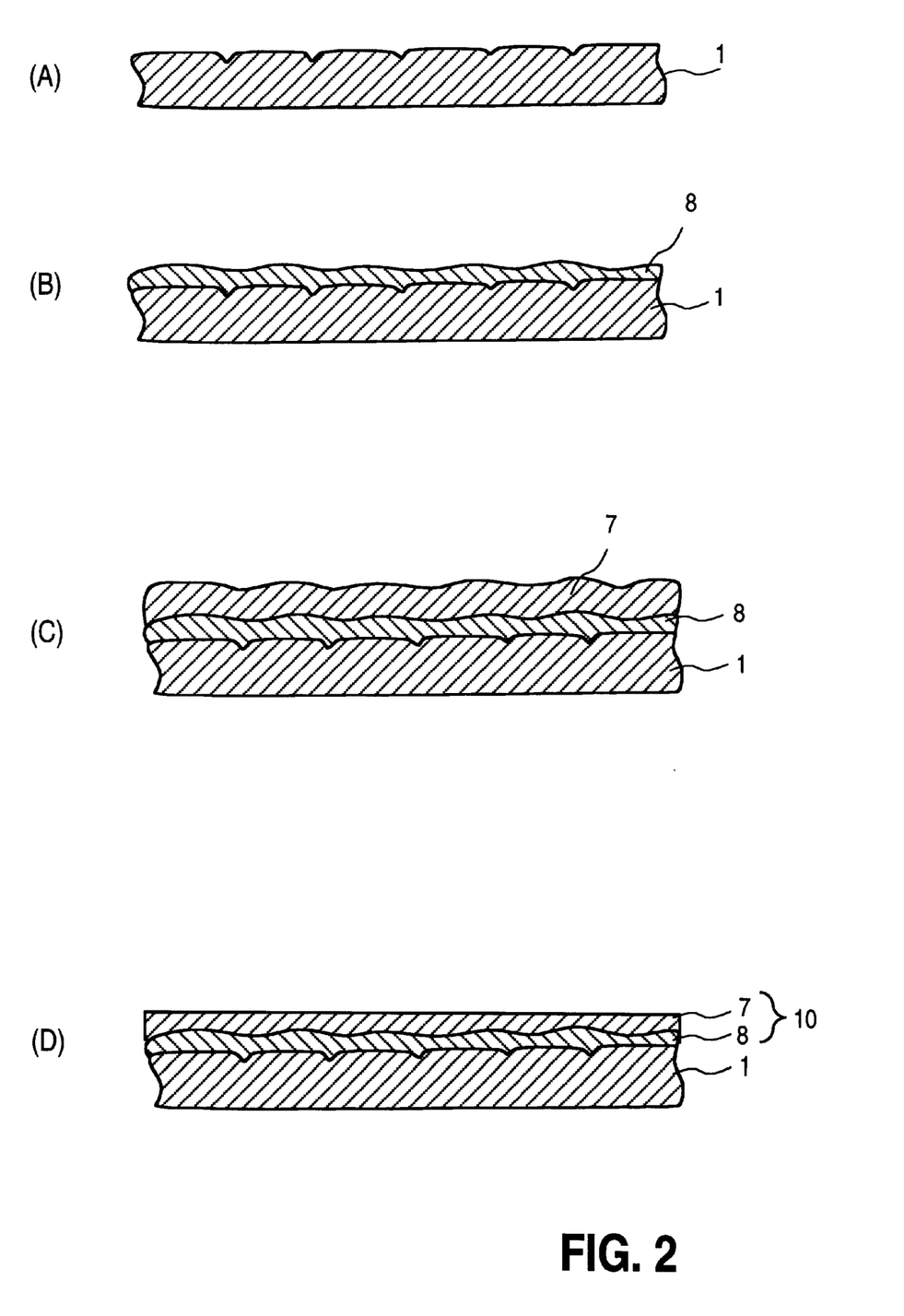
FIG. 2 shows the process of the method for forming the oxide film of another embodiment of the present invention and shows the states when the oxide film is formed on the substrate.
Figure 3:
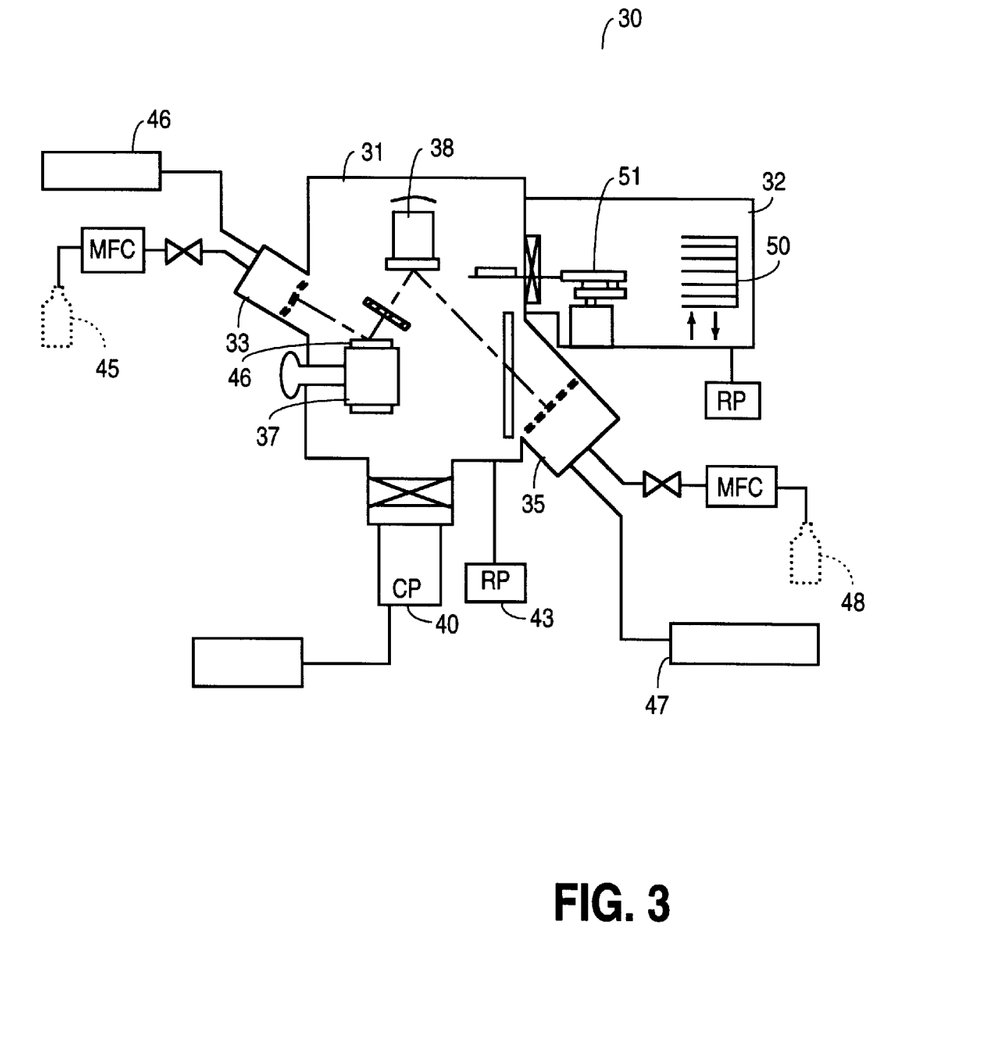
FIG. 3 is a diagram of the ion beam sputtering system.

FIG. 1 shows the process for forming the oxide film in the implementation of the present invention and shows the states where the oxide film is formed on the substrate 1. FIG. 2 shows the process for the formning the oxide film in another implementation of the present invention and shows the states where the oxide film is formed on the substrate 1. FIG. 3 is a schematic of the ion beam sputtering system.

In the following discussion, the substrate 1 which is the target film material is the $Al_2O_3$-TiO ceramic substrate that is identical to the one described for the conventional technology. In this implementation, a metal oxide film of aluminum oxide is provided on the substrate 1 as shown in FIG. 1(*a*).

In the method for forming the oxide film of this implementation, first, deposition is performed by bias sputtering followed by deposition by ion beam sputtering.

The first deposition operation uses the bias sputtering system 100 described for the conventional technology. For example, aluminum oxide is deposited on the substrate 1 under the film deposition conditions listed in Table 1 to form a 10 μm thick metal oxide film 7.

TABLE 1

| Substrate power supply output | 2 kW |
|---|---|
| Target power supply output | 15 kW |
| Input power | 7.5 kW |
| Bias voltage | −130 V |
| Target | $Al_2O_3$, 99.9% pure |
| Sputter gas | Ar |
| | Flow of 140 SCCM |
| | Gas pressure of $2.0 \times 10^{-4}$ Torr |

The formation states of the metal oxide film 7 are the same as those in FIG. 1(*b*). Unevenness develops on the surface as in conventional technology.

Next, the metal oxide film 8 of aluminum oxide is repeatedly deposited in layers by ion beam sputtering on the metal oxide film 7.

Deposition by ion beam sputtering uses an ion beam sputtering system 30, for example, as shown in FIG. 3.

The ion beam sputtering system 30 is divided into the primary vacuum chamber 31 as the processing chamber and the preparation chamber 32.

The primary vacuum chamber 31 is provided with two independent ion generation sources 33, 35 on its sides. Furthermore, the target holder 37, substrate holder 18, and neutralizer (not shown) are located in the primary vacuum chamber 31.

The primary vacuum chamber 31 is connected to the cryopump (vacuum pump) 40 via the main valve 39 and is directly connected to the rotary vacuum pump 43. Its interior can be kept in a specific vacuum state. The reason for connecting two vacuum pumps, the cryopump (vacuum pump) 40 and the rotary vacuum pump 43, to the primary vacuum chamber 31 is the large capacity of the primary vacuum chamber 31. The objective is to have the large-capacity rotary vacuum pump 43 pull the vacuum until reaching some degree of vacuum. Then the cryopump (vacuum pump) 40 is computer controlled in order to reach a higher vacuum or to maintain the vacuum.

The object drawn on the left side of the figure inside the two ion generation sources 33, 35 installed in the primary vacuum chamber 31 is the sputter ion generation source. Its ejection port is directed towards the target holder 37. The argon gas source 45 is connected via the mass flow controller (MFC) to the sputter ion generation source 33 and is supplied the argon gas that will be ionized. The ion source power supply 46 is connected to the sputter ion generation source 33. The neutralizer is installed inside the sputter ion generation source 33. The dispersion of the ion beam is prevented by the action of the neutralizer.

The argon gas described above is ionized in the sputter ion generation source 33. The Ar ions for sputtering are ejected towards the target 46.

The other ion generation source 35 generates the assist ions. Similar to the sputter ion generation source 33 described earlier, the assist ion generation source 35 is connected to the ion source power supply 47, and the gas source 48 is connected via the mass flow controller (WFC). The gas source 48 connected to the assist ion generation source 35 supplies the gas mixture of argon and oxygen.

A neutralizer is also installed inside the assist ion generation source 35.

In the assist ion generation source 35, the ejection port is directed towards the substrate support 38.

Cooling pipes are laid out in the ion generation sources 33, 35, the target holder 37, and the substrate holder 38 described earlier. During sputtering, these parts are suitably cooled.

The cassette elevator 50 for preparing the substrate 1 and the robot 51 for transferring the substrate 1 are placed in the preparation chamber 32.

In the ion beam sputter system 30, the Ar ions emitted from the sputter ion generation source 33 collide with the target 46 to sputter the metal oxide. Then this sputtered metal oxide adheres to the substrate 1 fixed by the substrate holder 38. Simultaneously, the Ar ions and O ions emitted from the assist ion generation source 35 directly collide with the substrate 1.

In this embodiment, the aluminum oxide is deposited on the metal oxide film 7 of the substrate 1 under the film deposition conditions listed in Table 2. The metal oxide 8 is layered to a 1,500 Å thickness on the metal oxide film 7.

TABLE 2

| Input power | 150 W |
|---|---|
| Positive grid voltage | 800 V |
| Negative grid voltage | 500 V |
| Target | $Al_2O_3$, 99.9% pure |
| Sputter gas | $ArO_3$ compound |
| | Gas flow of 10 SCCM |
| | Gas pressure of $2.5 \times 10^{-4}$ Torr |
| Neutralizer current | 200 mA |

FIG. 1(*c*) shows the results of the deposition. Two layers of the metal oxide films 7, 8 are formed on the substrate 1. To simplify the explanation, in FIG. 1(*c*), the metal oxide 8 is drawn much thicker than its actual proportion.

As in conventional technology, chemical polishing is performed next by using an alkali colloidal silica.

The metal oxide film 8 formed by ion beam sputtering is highly pure and is more homogeneous. By executing chemical polishing, the unevenness in the metal oxide film 7 formed by bias sputtering in FIG. 1(*d*) is filled in by the metal oxide film 8 formed by ion beam sputtering, so an even insulating layer 10 without pits can be formed.

Similar to the well-known structure for a thin film magnetic head, a magnetic film, a gap layer, and a conducting coil layer are deposited in layers on the insulating layer 10.

When the insulating layer 10 in the substrate portion of the thin film magnetic head is examined under magnification and analyzed in detail, the insulating layer 10 on the substrate 1 consists of two deposited layers. These layers are metal oxides made of the same materials but with different degrees of purity. Specifically, the purity of the outer layer is higher than the purity of the part in contact with the substrate 1.

In the above embodiment, deposition is initially performed by bias sputtering followed by deposition by ion beam sputtering. Even if the sputtering process order is reversed, suitable results can be expected.

In other words, deposition is first performed by ion beam sputtering. The metal oxide film 8 is formed on the substrate 1 as shown in FIG. 2(b).

The thickness of the metal oxide film 8 is about 1,500 Å as in the previous embodiment. In addition, the system used in the deposition and the deposition conditions are identical to those in the earlier implementation.

The deposition result is to almost completely fill in the pits on the substrate 1 as shown in FIG. 2(b).

Deposition is performed by bias sputtering. As shown in FIG. 2(c), a 10 μm thick metal oxide film 7 is formed on the metal oxide film 8.

As in the preceding implementation, chemical polishing is performed by using alkali colloidal silica.

In this implementation, the pits on the substrate 1 are filled by the ion beam sputtering as described above and the surface is almost level. Even if ordinary bias sputtering is executed next, deterioration of the substrate surface does not develop. Consequently, since the etching by chemical polishing is uniform, unevenness does not develop on the surface of the metal oxide film 7. The surface becomes smooth as shown in FIG. 2(d).

When the insulating layer 10 formed by this implementation is examined, the oxides on the substrate 1 are deposited in two layers. These layers are metal oxides made of the same materials but with different purities. The purity of the part in contact with the substrate 1 has higher purity than the outer layer.

In the above implementations, deposition is performed once by bias sputtering and once by ion beam sputtering. The oxide films were formed in single layers. Of course, the deposition can be repeated to form multiple oxide films.

The discussions of the conventional technology and implementations described the purpose of smoothing the metal oxide film by chemical polishing. However, the final smoothing of the metal oxide film is not limited to chemical polishing, but can use a smoothing method with no or little etching. For example, a method called diamond polishing is used.

Next, embodiments of the present invention are described.

First, an embodiment of the present invention forms the metal oxide film on the substrate 1 by the process shown in FIG. 1. The substrate material, sputtering process order, film thickness, target material, and film deposition conditions are the same as those in the description for FIG. 1. The metal oxide film 7 is formed with a 10 μm thickness on the substrate 1 by bias sputtering based on the film deposition conditions listed in Table 1. Next, the metal oxide film 8 was deposited in a 1,500 Å layer by ion beam sputtering under the film deposition conditions listed in Table 2.

As a comparison example, a substrate from the same lot is used, and the oxide film is formed only by bias sputtering. The thickness of the oxide film is adjusted to around 10.15 μm in the state where the deposition ends in line with the embodiment and conditions of the present invention. The film deposition conditions for bias sputtering are identical to those in Table 1.

When both types are observed under magnification, the metal oxide film made according to this embodiment is smoother than in the comparison example.

Similarly, the oxide film is formed on the substrate 1 by the process in FIG. 2. The substrate material, sputtering process order, film thickness, target material, and film deposition conditions are identical to those in the description for FIG. 2. The 10 μm thick metal oxide film 7 is formed by ion beam sputtering a 1,500 Å thickness on the substrate 1 based on the film deposition conditions listed in Table 2 and by depositing a layer by bias sputtering based on the conditions in Table 1.

When the oxide film formed by the second embodiment was observed under magnification, the oxide film made according to this embodiment is smoother than the comparison example described above.

There are many different thicknesses for the oxide film deposited by ion beam sputtering Next, the relationship between the thickness of the film by ion beam sputtering and the smoothing of the surface was examined. The result verified the effect that a significant difference exists when the thickness of the oxide film formed by the ion beam sputtering is 1% or less than the thickness of the oxide film formed by bias sputtering. As the oxide film by ion beam sputtering becomes thicker, the surface becomes smoother. When the thickness of the oxide film formed by ion beam sputtering exceeds 10% of the thickness of the oxide film formed by bias sputtering, large variations were not verified.

As described above, the method for forming the oxide film of the present invention fills in the dents in the substrate or the unevenness of the oxide film surface by the oxide film in ion beam sputtering.

The effects are the oxide film made in accordance with the present invention has a constant etching speed at any position when chemical polishing after forming the film; and the surface is smoothed.

The method for forming the oxide film of claim 3 provides smoothing, offers a superior balance for industry, and is very practical.

The electronic device of claim 4 is not affected very much by pits, its characteristics are stable, and the yield is high.

I claim:

1. A method for forming an oxide film, the method comprising:

depositing a first metal oxide film layer having indentations on a substrate of a thin film magnetic head by bias sputtering;

depositing a second metal oxide film layer having indentations by ion beam sputtering on the first metal oxide film layer such that indentations of the first metal oxide film layer are filled with the second metal oxide film layer, the first metal oxide film layer including a metal oxide material of a first degree of purity, the second metal oxide film layer including the metal oxide material having a second degree of purity different than the first degree of purity; and polishing the second metal oxide film layer to reduce indentations of the second metal oxide film layer.

2. A method for forming an oxide film, the method comprising:

depositing a first metal oxide film layer having indentations on a substrate of a thin film magnetic head by ion beam sputtering such that indentations of the substrate are filled with the first metal oxide film layer;

depositing a second metal oxide film layer by having indentation bias sputtering on the first metal oxide film layer, the first metal oxide film layer including a metal oxide material of a first degree of purity, the second metal oxide film layer including the metal oxide material having a second degree of purity different than the first degree of purity; and polishing the second metal oxide film layer to reduce indentations of the second metal oxide film layer.

3. A method for forming an oxide film as in claim 1 or 2 wherein a thickness of the layer formed by ion beam sputtering is 1 to 10% of a thickness of the layer formed by bias sputtering.

4. A method for forming an oxide film, the method comprising:

depositing a first film layer including a metal oxide material on a substrate of a thin film magnetic head, wherein the depositing of the first film layer is performed by bias sputtering; and depositing a second film layer including the metal oxide material on the first film layer, wherein the depositing of the second film layer is performed by ion beam sputtering, wherein the metal oxide material of the first film layer has a first degree of purity greater than a second degree of purity of the metal oxide material of the second film layer.

5. A method for forming an oxide film, the method comprising:

depositing a first film layer including a metal oxide material on a substrate of a thin film magnetic head, wherein the depositing of the first film layer is performed by ion beam sputtering; and depositing a second film layer including the metal oxide material on the first film layer, wherein the depositing of the second film layer is performed by bias sputtering, wherein the metal oxide material of the first film layer has a first degree of purity greater than a second degree of purity of the metal oxide material of the second film layer.

* * * * *